US012666650B2

(12) United States Patent
Li et al.

(10) Patent No.: US 12,666,650 B2
(45) Date of Patent: Jun. 23, 2026

(54) FIELD-EFFECT TRANSISTORS (FETs) EMPLOYING THERMAL EXPANSION OF WORK FUNCTION METAL LAYERS FOR STRAIN EFFECT AND RELATED FABRICATION METHODS

(71) Applicant: QUALCOMM Incorporated, San Diego, CA (US)

(72) Inventors: Xia Li, San Diego, CA (US); Bin Yang, San Diego, CA (US); Jun Yuan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 403 days.

(21) Appl. No.: 18/333,004

(22) Filed: Jun. 12, 2023

(65) Prior Publication Data
US 2024/0413219 A1      Dec. 12, 2024

(51) Int. Cl.
*H01L 29/423*          (2006.01)
*H01L 21/8238*       (2006.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .. H10D 30/6735; H10D 30/014; H10D 30/43; H10D 30/6757; H10D 62/121;
(Continued)

(56) References Cited

U.S. PATENT DOCUMENTS

| | | | |
|---|---|---|---|
| 8,901,667 B2 | 12/2014 | Jagannathan et al. | |
| 10,699,966 B2 | 6/2020 | Lee et al. | |

(Continued)

FOREIGN PATENT DOCUMENTS

| | | |
|---|---|---|
| WO | 2017171860 A1 | 10/2017 |

OTHER PUBLICATIONS

Erben, E. et al., "Work Function Setting in High-k Metal Gate Devices," in Complementary Metal Oxide Semiconductor, Edited by Kim Ho Yeap and Humaira Nisar, Nov. 5, 2018, IntechOpen, 14 pages.

(Continued)

*Primary Examiner* — Tong-Ho Kim
(74) *Attorney, Agent, or Firm* — Withrow & Terranova, PLLC

(57) ABSTRACT

Forces applied to the channel regions of semiconductor slabs in a first direction relative to the semiconductor slab, can create strains in the crystal structure that improve carrier mobility to improve drive strength in the channel region. In a three-dimensional (3D) FET structure, a work function metal layer is provided on opposing faces of semiconductor slabs to cause a force to be exerted on the channel regions in a first direction corresponding to current flow. The force in the first direction is either tensile force or compressive force, depending on a FET type (N or P) employing the semiconductor slab, and is provided to create strain in a crystalline structure of the semiconductor slab to improve carrier mobility in the channel region. Increasing carrier mobility in the channel regions in a 3D FET structure increases drive strength of the 3D FET, which saves area in an integrated circuit.

23 Claims, 12 Drawing Sheets

(51) Int. Cl.

| | |
|---|---|
| *H01L 27/06* | (2006.01) |
| *H01L 27/092* | (2006.01) |
| *H01L 29/06* | (2006.01) |
| *H01L 29/49* | (2006.01) |
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/66* | (2025.01) |
| *H10D 84/01* | (2025.01) |
| *H10D 84/03* | (2025.01) |
| *H10D 84/85* | (2025.01) |
| *H10D 88/00* | (2025.01) |

(52) U.S. Cl.
CPC ....... *H10D 30/6757* (2025.01); *H10D 62/121* (2025.01); *H10D 64/665* (2025.01); *H10D 84/0167* (2025.01); *H10D 84/038* (2025.01); *H10D 84/85* (2025.01); *H10D 88/00* (2025.01)

(58) Field of Classification Search
CPC ............. H10D 64/665; H10D 84/0167; H10D 84/038; H10D 84/85; H10D 88/00; H10D 30/794; H10D 64/666; H10D 84/0177; B82Y 10/00

USPC ......................................................... 257/288
See application file for complete search history.

(56) References Cited

U.S. PATENT DOCUMENTS

| | | | |
|---|---|---|---|
| 2007/0138559 A1 | 6/2007 | Bohr | |
| 2017/0011971 A1* | 1/2017 | Zhang | H10D 64/665 |
| 2017/0200798 A1* | 7/2017 | Chen | H10D 84/038 |
| 2020/0098756 A1* | 3/2020 | Lilak | H10D 62/83 |
| 2023/0062162 A1* | 3/2023 | Chen | H01L 23/5226 |
| 2023/0170420 A1* | 6/2023 | Murthy | H10D 30/791 |
| | | | 257/347 |

OTHER PUBLICATIONS

Kino H., et al., "Negative-Thermal-Expansion Gate Electrode (NTEG) to Introduce Tensile Strain into the channel of MOSFETs", 2023 7th IEEE Electron Devices Technology & Manufacturing Conference (EDTM), Apr. 2023, 4 pages.

International Search Report and Written Opinion for International Patent Application No. PCT/US2024/031342, mailed Sep. 20, 2024, 14 pages.

\* cited by examiner

3D FET STRUCTURE
300

IC 301

318A     316   314     318B     CFET 302

312

306

304U 320A   308   310   320B

CHANNEL
REGION 400

GATE MATERIAL
406

WFM LAYER 404

FZ1

408

FX1

DIELECTRIC
LAYER 410

416

414

412

SEMICONDUCTOR
SLAB 402

CHANNEL
REGION 500A

CHANNEL
REGION 500B

3D FET STRUCTURE
600

3D FET STRUCTURE
700

718(1)
702(1)
720(1)
704(1)
FZ7
714
718(2)
702(2)
704(2)
FY7     FY7
720(2)
714
718(3)
704(3)
702(3)
720(3)
716

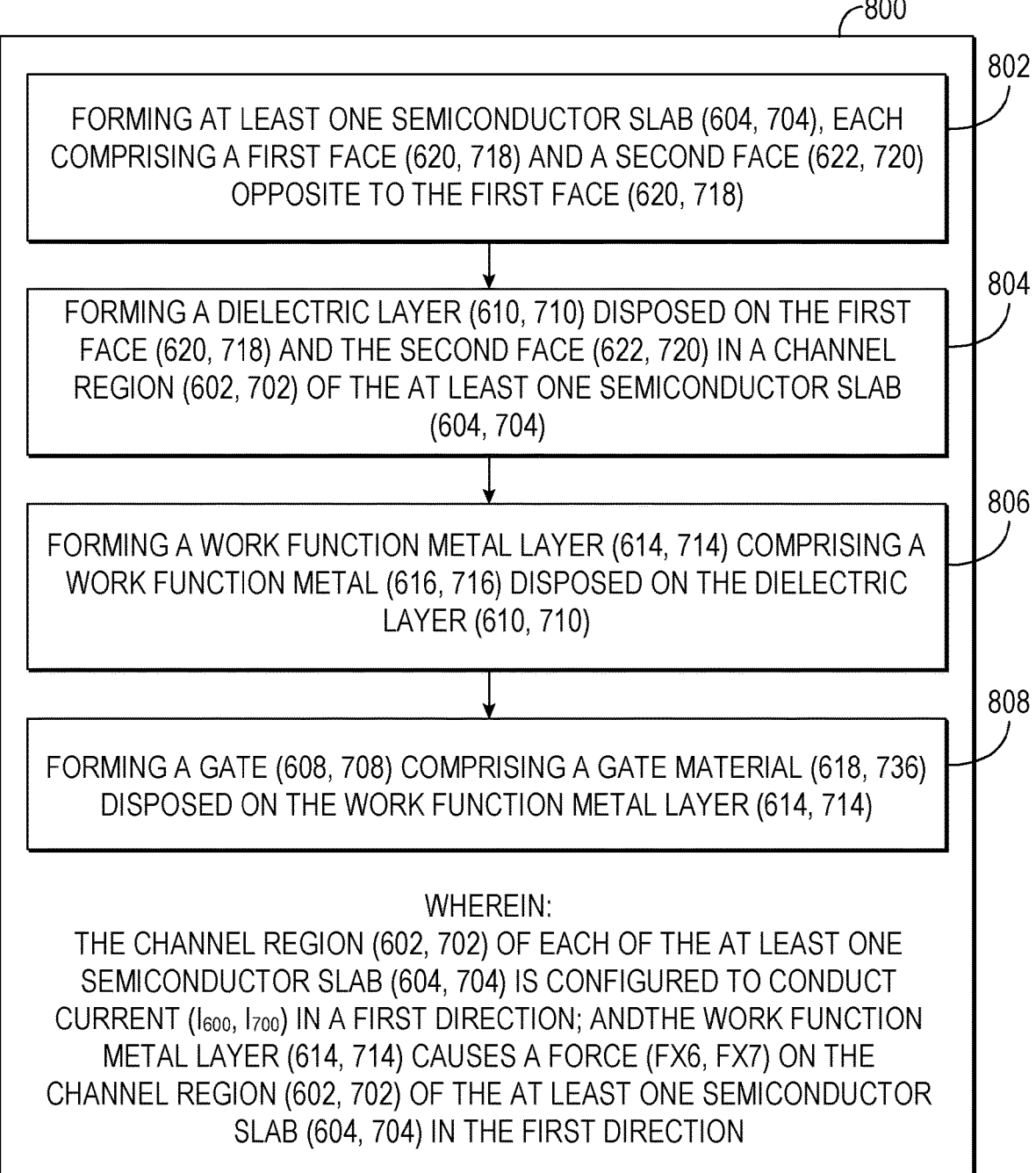

800

802
FORMING AT LEAST ONE SEMICONDUCTOR SLAB (604, 704), EACH COMPRISING A FIRST FACE (620, 718) AND A SECOND FACE (622, 720) OPPOSITE TO THE FIRST FACE (620, 718)

804
FORMING A DIELECTRIC LAYER (610, 710) DISPOSED ON THE FIRST FACE (620, 718) AND THE SECOND FACE (622, 720) IN A CHANNEL REGION (602, 702) OF THE AT LEAST ONE SEMICONDUCTOR SLAB (604, 704)

806
FORMING A WORK FUNCTION METAL LAYER (614, 714) COMPRISING A WORK FUNCTION METAL (616, 716) DISPOSED ON THE DIELECTRIC LAYER (610, 710)

808
FORMING A GATE (608, 708) COMPRISING A GATE MATERIAL (618, 736) DISPOSED ON THE WORK FUNCTION METAL LAYER (614, 714)

WHEREIN:
THE CHANNEL REGION (602, 702) OF EACH OF THE AT LEAST ONE SEMICONDUCTOR SLAB (604, 704) IS CONFIGURED TO CONDUCT CURRENT ($I_{600}$, $I_{700}$) IN A FIRST DIRECTION; ANDTHE WORK FUNCTION METAL LAYER (614, 714) CAUSES A FORCE (FX6, FX7) ON THE CHANNEL REGION (602, 702) OF THE AT LEAST ONE SEMICONDUCTOR SLAB (604, 704) IN THE FIRST DIRECTION

FIG. 8

FIELD-EFFECT TRANSISTORS (FETs) EMPLOYING THERMAL EXPANSION OF WORK FUNCTION METAL LAYERS FOR STRAIN EFFECT AND RELATED FABRICATION METHODS

BACKGROUND

I. Field of the Disclosure

The technology of the disclosure relates generally to transistors in integrated circuits and, more particularly, to three-dimensional transistors.

II. Background

In field-effect transistors (FETs), a gate adjacent to a channel region of a doped semiconductor controls current flow through the channel region. A voltage applied to the gate either opens or closes a conductive path below the surface of the channel region adjacent to the gate. Planar FETs include channel regions formed in the surface of a semiconductor substrate, and a gate disposed on the surface. To increase the drive strengths of transistors, three-dimensional (3D) FETs have been developed with a gate (e.g., gate material) adjacent to at least two sides of semiconductor structures (e.g., fins, slabs, nanosheets, nanowires) to increase the surface area in which a conductive path can be induced. Fin type FETs (FinFETs) and gate-all-around (GAA) transistors are examples having gate material disposed on multiple sides of a semiconductor structure to increase drive strength in a fixed area of a substrate. To further increase drive strength, it has been found that applying a force (e.g., stress or strain) in particular directions relative to the crystalline structure of the semiconductor channel region of a FET can affect carrier mobility. However, methods are still being developed for ways to apply such forces without compromising FET functionality.

SUMMARY

Field-effect transistors (FETs) employing thermal expansion of work function metal layers for strain effect is disclosed herein. Methods of fabrication of FETs including work function metal layers for strain effect are also disclosed. Semiconductor slabs (e.g., nanosheets) in gate-all-around (GAA) FETs, fork-sheet FETs, and complementary FETs (CFETs) are oriented along a plane of a crystal structure of a semiconductor wafer and are configured to conduct current in a first direction relative to the crystal structure. Forces applied to the channel region of the semiconductor slabs in the first direction relative to the semiconductor slab, can create strains in the crystal structure that improve carrier mobility to improve drive strength in the channel region. In an exemplary three-dimensional (3D) FET structure disclosed herein, a work function metal layer is provided on opposing faces of semiconductor slabs to cause a force to be exerted on the channel regions of the semiconductor slabs in a first direction corresponding to a current flow direction. The force exerted in the first direction is one of a tensile force and a compressive force, depending on a type of dopant provided in the semiconductor slab, and is provided to create a strain in a crystalline structure of the semiconductor slab that improves mobility of majority carriers (e.g., electrons or holes) in the channel region. Increasing carrier mobility in the channel regions of semiconductor slabs in a 3D FET structure increases drive strength of the 3D FET, which saves area in an integrated circuit (IC). The work function metal layer comprises a work function metal different than a gate material of a gate adjacent to the channel region, and is disposed between a dielectric layer and the gate. In some examples, the work function metal also has a work function within a work function range to provide a desired threshold voltage in the 3D FET.

In this regard, in one aspect, a 3D FET structure is disclosed. The 3D FET structure includes at least one semiconductor slab, each comprising a first face and a second face opposite to the first face. The 3D FET structure also includes a dielectric layer disposed on the first face and the second face in a channel region of the at least one semiconductor slab. The 3D FET structure also includes a work function metal layer comprising a work function metal disposed on the dielectric layer. The 3D FET structure also includes a gate comprising a gate material disposed on the work function metal layer. The channel region of each of the at least one semiconductor slab is configured to conduct current in a first direction. The work function metal layer is configured to cause a first force on the channel region of the at least one semiconductor slab in the first direction.

In another aspect, a 3D CFET structure is disclosed. The 3D CFET structure includes a first type FET. The first type FET includes at least one first semiconductor slab each comprising a first face and a second face opposite to the first face. The first type FET also includes a first dielectric layer disposed on the first face and the second face in a channel region of the at least one first semiconductor slab. The first type FET also includes a first work function metal layer comprising a first work function metal disposed on the first dielectric layer. The first type FET also includes a first gate comprising a gate material disposed on the first work function metal layer. The 3D CFET structure also includes a second type FET. The second type FET includes at least one second semiconductor slab each comprising a third face and a fourth face opposite to the third face. The second type FET also includes a second dielectric layer disposed on the third face and the fourth face in a channel region of the at least one second semiconductor slab. The second type FET also includes a second work function metal layer comprising a second work function metal disposed on the second dielectric layer. The second type FET also includes a second gate comprising the gate material disposed on the second work function metal layer. The first work function metal layer is configured to cause a tensile force on the channel region of the at least one first semiconductor slab. The second work function metal layer is configured to cause a compressive force on the channel region of the at least one second semiconductor slab.

In another aspect, a method of fabricating a complementary 3D FET structure is disclosed. The method includes forming at least one semiconductor slab, each comprising a first face and a second face opposite to the first face. The method also includes forming a dielectric layer disposed on the first face and the second face in a channel region of the at least one semiconductor slab. The method also includes forming a work function metal layer comprising a work function metal disposed on the dielectric layer. The method also includes forming a gate comprising a gate material disposed on the work function metal layer. The channel region of each of the at least one semiconductor slab is configured to conduct current in a first direction. The work function metal layer causes a force on the channel region of the at least one semiconductor slab in the first direction.

BRIEF DESCRIPTION OF THE DRAWINGS

FIG. 8 is a flowchart of a method for fabricating a 3D FET structure including, but not limited to, any of the 3D FETs in FIGS. 1-3 and 6A-7B, including work function metal layers on faces of a semiconductor slab to cause forces to be exerted in a current direction in a channel region to improve drive strength;

DETAILED DESCRIPTION

Figure 1:
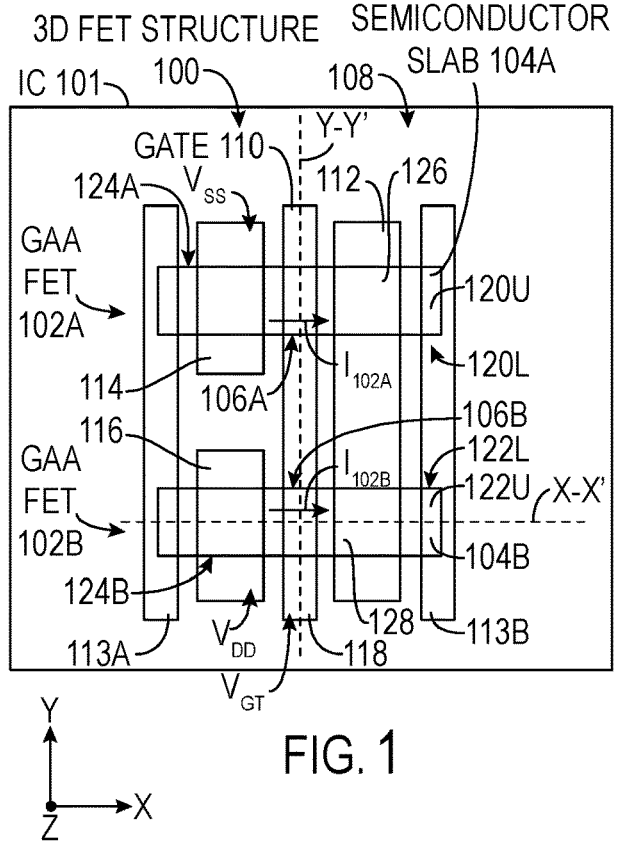
FIG. 1 is a top view of a first example of a three-dimensional (3D) field-effect transistor (FET) structure comprising gate-all-around (GAA) FETs including semiconductor slabs including a work function metal layer to improve drive strength.

Several exemplary aspects of the present disclosure are described in reference to the drawing figures. The word "exemplary" is used herein to mean "serving as an example, instance, or illustration." Any aspect described herein as "exemplary" is not necessarily to be construed as preferred or advantageous over other aspects.

Field-effect transistors (FETs) employing thermal expansion of work function metal layers for strain effect is disclosed herein. Methods of fabrication of FETs including work function metal layers for strain effect are also disclosed. Semiconductor slabs (e.g., nanosheets) in gate-all-around (GAA) FETs, fork-sheet FETs, and complementary FETs (CFETs) are oriented along a plane of a crystal structure of a semiconductor wafer and are configured to conduct current in a first direction relative to the crystal structure. Forces applied to the channel region of the semiconductor slabs in the first direction relative to the semiconductor slab, can create strains in the crystal structure that improve carrier mobility to improve drive strength in the channel region. In an exemplary three-dimensional (3D) FET structure disclosed herein, a work function metal layer is provided on opposing faces of semiconductor slabs to cause a force to be exerted on the channel regions of the semiconductor slabs in a first direction corresponding to a current flow direction. The force exerted in the first direction is one of a tensile force and a compressive force, depending on a FET type (N or P) employing the semiconductor slab, and is provided to create a strain in a crystalline structure of the semiconductor slab that improves mobility of majority carriers (e.g., electrons or holes) in the channel region. Increasing carrier mobility in the channel regions of semiconductor slabs in a 3D FET structure increases drive strength of the 3D FET, which saves area in an integrated circuit (IC). The work function metal layer comprises a work function metal different than a gate material of a gate adjacent to the channel region, and is disposed between a dielectric layer and the gate. In some examples, the work function metal also has a work function within a work function range to provide a desired threshold voltage in the 3D FET.

FIG. 1 is a top view of a three-dimensional (3D) field-effect transistor (FET) structure 100 on an integrated circuit 101 in a first example comprising gate-all-around (GAA) FETs 102A, 102B that include semiconductor slabs 104A, 104B each having a work function metal (WFM) layer disposed on surfaces to improve drive strength. The semiconductor slabs 104A, 104B are formed from a semiconductor substrate (not shown), such as a silicon substrate, which has a crystalline structure or crystal matrix, and each may be included in a corresponding stack of semiconductor layers (not shown). The semiconductors slabs 104A, 104B are formed with a predetermined orientation to the crystal matrix of the semiconductor substrate and are doped to be an either an N-channel (NMOS) or a P-channel (PMOS). It is known that applying forces in certain directions relative to the semiconductor slabs 104A, 104B (e.g., relative to the crystal matrix) causes strains in the crystal matrix that can increase or decrease mobility of majority carriers (i.e., electrons or holes, depending on the type of dopant) through the crystal matrix. Increasing the majority carrier mobility in channel regions 106A, 106B of the semiconductor slabs 104A, 104B can increase the drive strength of the GAA FETs 102A, 102B.

The semiconductor slabs 104A, 104B extend in a first, X-axis direction, which is a direction of flow of current $I_{102A}$ and $I_{102B}$. In response to forces in the first direction, the carrier mobility can be changed in both of the semiconductor slabs 104A, 104B. As an example, the semiconductor slab 104A in the GAA FET 102A may be an NMOS channel (e.g., channel p-type material doped with a trivalent dopant) and the semiconductor slab 104B in the GAA FET 102B may be a PMOS channel (e.g., channel n-type material doped with a pentavalent dopant). In an NMOS channel, the majority carriers are electrons, and the mobility of electrons is increased in the presence of a strain caused by a tensile force in the first direction, which may also be referred to as a longitudinal direction of the semiconductor slab 104A. In a PMOS channel, the majority carriers are "holes," and their mobility is increased in the presence of a strain caused by a compressive force in the first direction (e.g., longitudinal).

The GAA FETs 102A, 102B in the 3D FET structure 100 are coupled together to form an inverter circuit 108 with a gate 110 extending in a second, Y-axis direction and functioning as an input to the inverter circuit 108. A contact 112 coupled to both of the semiconductor slabs 104A and 104B functions as an output of the inverter circuit 108. The 3D FET structure also includes dummy gates 113A, 113B that are not functional. Contacts 114 and 116 are configured to be coupled to either a reference voltage $V_{SS}$ or a power supply voltage $V_{DD}$. The gate 110 is disposed over the semiconductor slabs 104A, 104B in channel regions 106A, 106B. A voltage $V_{GT}$ applied to the gate 110 to change FETs to an inversion state allows current to flow in one of the channel regions 106A, 106B. The gate 110 is formed of a conductive gate material 118 that is disposed around a perimeter of the semiconductor slabs 104A, 104B, which includes first, upper faces 120U, 122U, respectively, and second lower faces 120L, 122L. The gate material 118 may be one of tungsten (W) and aluminum (Al). As described in more detail below, WFM layers 124A, 124B are also disposed around the perimeters of, or at least on the upper faces 120U, 122U and the lower faces 120L, 122L, of the semiconductor slabs 104A, 104B, respectively. The WFM layers 124A, 124B are disposed between the gate material 118 and the semiconductor slabs 104A, 104B.

The WFM layer 124A causes a tensile force to be exerted in the first direction on the channel region 106A and the WFM layer 124B causes a compressive force to be exerted in the first direction on the channel region 106B. The WFM layer 124A may comprise a work function metal 126 to provide the tensile force. The work function metal 126 may be manganin nitride (MnN), for example. The WFM layer 124B may comprise a work function metal 128 to provide the compressive force, and the work function metal 128 may be any one of silver (Ag), nickel aluminum (NiAl), or iron nitride (FeN), for example. In some examples, the work function metal 128 configured to provide a compressive force does not comprise titanium (Ti) aluminum (Al) (TiAl). Metals other than those identified here may be used for the work function metals 126 and 128. However, when selecting appropriate work function metals, the direction of a force provided is not the only consideration because the work function metals 126 and 128 also need to have a work function that provides a desired threshold voltage in the NMOS GAA FET 102A and the PMOS GAA FET 102B.

Figure 2:
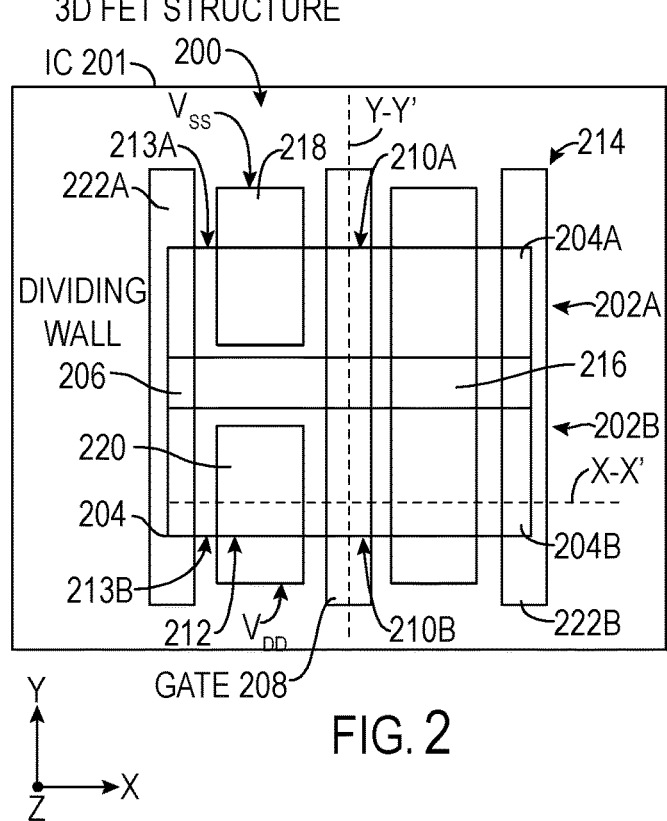
FIG. 2 is a top view of a second example of a 3D FET structure comprising fork-sheet FETs including semiconductor slabs including a work function metal layer to improve drive strength.

FIG. 2 is a top view of a second example of a 3D FET structure 200 in an IC 201 comprising fork-sheet FETs 202A, 202B including semiconductor slabs 204A, 204B, respectively. The semiconductor slabs 204A, 204B were originally part of a single semiconductor slab 204 before formation of a dividing wall 206 that electrically separates the semiconductor slab 204A from the semiconductor slab 204B. The semiconductor slabs 204A, 204B extend in a first, X-axis direction, and a gate 208 is disposed across the semiconductor slabs 204A, 204B in a second, Y-axis direction. The gate 208 is disposed around the semiconductor slabs 204A, 204B in channel regions 210A, 210B. Before formation of the dividing wall 206 and the gate 208, a WFM layer 212 is disposed on the semiconductor slab 204, such that the WFM layer 212 is between the gate 208 and the semiconductor slabs 204A, 204B. Formation of the dividing wall 206 splits the semiconductor slab 204 into the semiconductor slabs 204A, 204B with each having one side that abuts the dividing wall 206. The WFM layer 212 is split into a WFM layer 213A disposed on the remaining three sides of the semiconductor slab 204A and a WFM layer 213B disposed on the remaining three sides of the semiconductor slab 204B.

In some examples, both of the semiconductor slabs 204A, 204B may be doped by a same dopant, such that both are a PMOS channel or both are an NMOS channel. In such examples, a same work function metal (not shown) would be employed in the WFM layers 213A, 213B. Alternatively, as in FIG. 2, one of the semiconductor slabs 204A, 204B may be a P-channel while the other is an N-channel. In such examples, the WFM layer 213A and the WFM layer 213B are formed of different materials, such as the work function metals 126 and 128 of FIG. 1.

The 3D FET structure 200 may be configured to be an inverter circuit 214 including a contact 216 coupled to both of the fork-sheet FETS 202A, 202B and functioning as an inverter output. The inverter circuit 214 also includes contacts 218 and 220 receiving the reference voltage $V_{SS}$ and the power supply voltage $V_{DD}$, respectively. The 3D FET structure 200 also includes dummy gates 222A and 222B. As described with reference to FIG. 1, a force in the first, X-axis direction in channel regions 210A,210B increases carrier mobility. A tensile force in the first direction on the NMOS channel (channel region 210A) and a compressive force in the first direction on the PMOS channel (channel region 210B) create strains that increase carrier mobility for greater drive strength.

Figure 3:
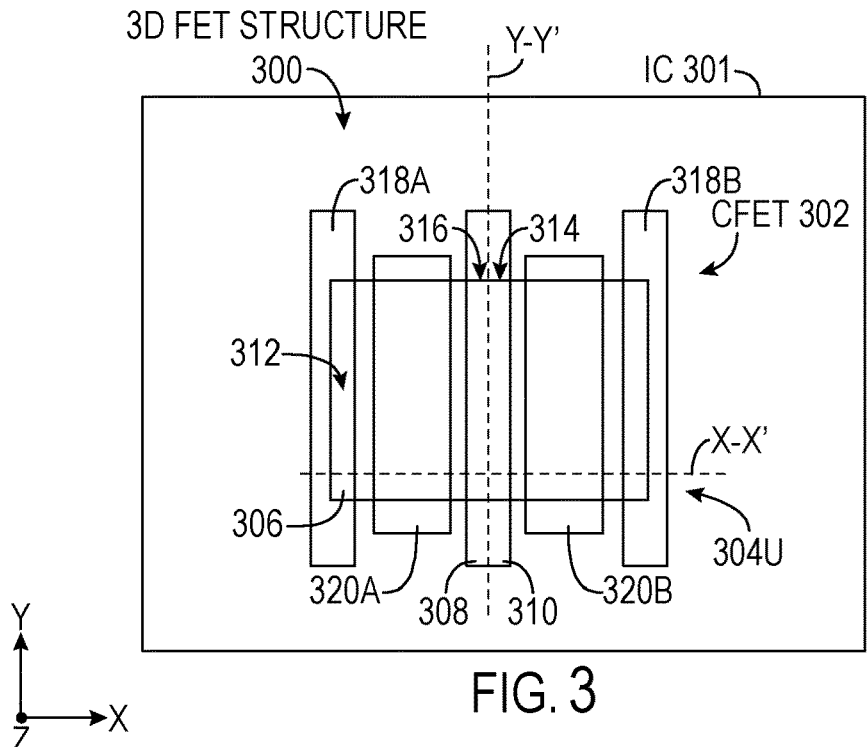
FIG. 3 is a top view of a third example of a 3D FET structure comprising a complementary FET (CFET) including a P-channel (PMOS) FET and an N-channel (NMOS) FET each including semiconductor slabs with work function metal layers to improve drive strength.

FIG. 3 is a top view of a third example of a 3D complementary FET structure 300 in an IC 301 comprising a complementary FET (CFET) 302 that includes an upper FET 304U disposed above (in the Z-axis direction), and a lower FET (not shown). The upper FET 304U includes a semiconductor slab 306 doped to be one of a PMOS channel or an NMOS channel with a semiconductor slab in the lower FET doped to be the opposite type. A current $I_{306}$ in the semiconductor slab 306 flows in the first, X-axis direction. A gate 308 extends in a second, Y-axis direction orthogonal to the X-axis direction. The gate 308 is disposed on (e.g., around) the semiconductor slab 306 and may also be disposed around the lower semiconductor slab. The term "disposed around" in this context is intended to mean that a gate material 310 of the gate 308 is disposed on and adjacent to at least a first, upper face 312 and a second, lower face (not shown) of the semiconductor slab 306 in a channel region 314. In this regard, the semiconductor slab 306 and the lower semiconductor slab may correspond to the semiconductor slabs 104A, 104B in FIG. 1 because the semiconductor slab may be doped to be an NMOS channel with a first WFM layer 316 providing a tensile force in the channel region 314 in the first direction, and the lower semiconductor slab (not shown) is doped to be a PMOS channel having a second WFM layer (not shown) providing a compressive force. The 3D FET structure 300 also includes dummy gates 318A, 318B and contacts 320A, 320B.

Figure 4:
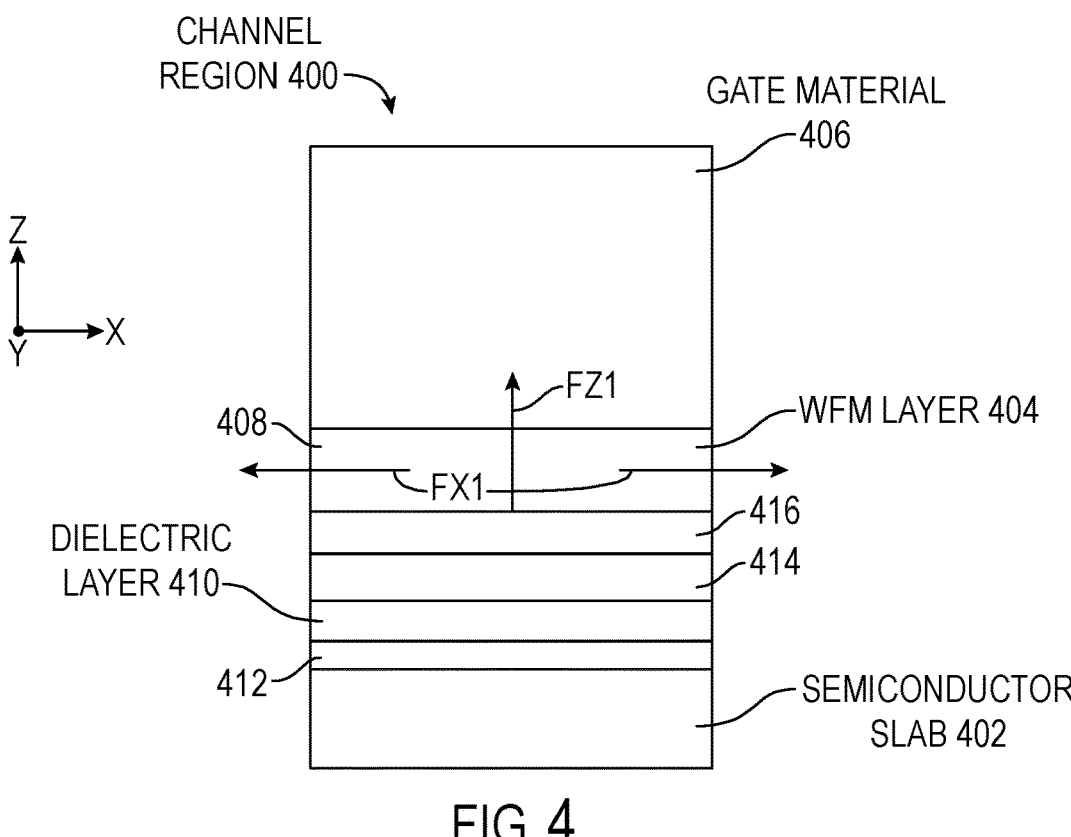
FIG. 4 is a cross-sectional side view of a channel region of a semiconductor slab in an NMOS FET in a 3D FET structure, including a work function metal layer to provide an improved drive strength.

FIG. 4 is a cross-sectional side view of a section of a channel region 400 in a semiconductor slab 402. The channel region 400 includes a WFM layer 404 to cause a force FX1 to be exerted in a first, X-axis direction to improve drive strength. The WFM layer 404 is between a gate material 406 and the semiconductor slab 402. The WFM layer 404 is formed from a work function metal 408 and is a different material than the gate material 406. The gate material 406 may be one of tungsten (W) and aluminum (Al), for example. The WFM layer 404 has a first thickness of less than 1-2 nanometers (nm). The gate material 406 has a second thickness of at least 50-200 nm. The primary function of the WFM layer 404 is to set a threshold voltage in the channel region 400. The channel region 400 in FIG. 4 is an NMOS channel region in which a work function metal may be selected for having a desired work function (e.g., approximately 4.1 electron volts (eV)). In a conventional NMOS channel region, a work function metal may include aluminum.

The work function metal 408 is selected to have a work function in a range of 4.0 to 4.25 eV to provide a similar or the same threshold voltage. In an exemplary aspect, the work function metal 408 is also selected to provide the additional function of causing a tensile force to be exerted on the semiconductor slab 402. Thus, the work function metal 408 is selected from among metals or metal compounds that have a different rate of volume change (e.g., expansion or contraction) than the semiconductor material (e.g., silicon) because the WFM layer 404 may be formed in a high temperature process.

Materials formed or deposited under high temperature conditions frequently contract upon cooling. However, some materials remain the same volume or expand upon cooling. If the work function metal 408 is deposited or formed on the semiconductor slab 402 at a higher temperature and does not change in size by a same amount as the semiconductor slab 402 upon cooling to a lower temperature (e.g., to an ambient temperature), the difference in size change causes forces to be exerted at an intersection of the work function metal 408 and the semiconductor slab 402. This concept is similar to that of a bimetallic strip used to indicate temperature.

For the work function metal 408 to provide a tensile force, the work function metal 408 (e.g., manganin nitride (MnN)) is selected from among metals that have the desired work function and do not contract as much (or contract at a lower rate of change) in the first, X-axis direction as the semiconductor slab 402. In this manner, the WFM layer 404 causes a tensile force to be exerted on the semiconductor slab 402 in the channel region 400.

As shown in FIG. 4, other layers are present between the work function metal 408 and the semiconductor slab 402 to electrically insulate the WFM layer 404 from the channel region 400. In this regard, the channel region 400 includes a dielectric layer 410 (e.g., high-K dielectric such as hafnium oxide) between the WFM layer 404 and the semiconductor slab 402. The dielectric layer 410 is formed on an interfacial layer 412 (e.g., $SiO_2$) that is formed directly on the semiconductor slab 402. The channel region 400 may include a cap layer 414 (e.g., a titanium nitride (TiN) layer) and a buffer layer 416 (e.g., a tantalum nitride (TaN) layer) between the dielectric layer 410 and the work function metal 408. The gate material 406 may be tungsten (W) or aluminum (Al), for example. Due to a difference in size between the semiconductor slab 402 and the work function metal layer 404 upon cooling, the WFM layer 404 causes a force to be exerted on the semiconductor slab 402 by way of forces on the intermediate layers (e.g., the buffer layer 416, the cap layer 414, the dielectric layer 410, and the interfacial layer 412).

The force FX1 in the first direction is due to differences in volume change in the first direction between the semiconductor slab 402 and the WFM layer 404. In addition, the WFM layer 404 may also change volume in other directions, such as in the Z-axis direction orthogonal to the first direction. In this manner, the WFM layer 404 may also cause a force FZ1 to be exerted on the semiconductor slab 402 in the Z-axis direction.

Figure 5A:
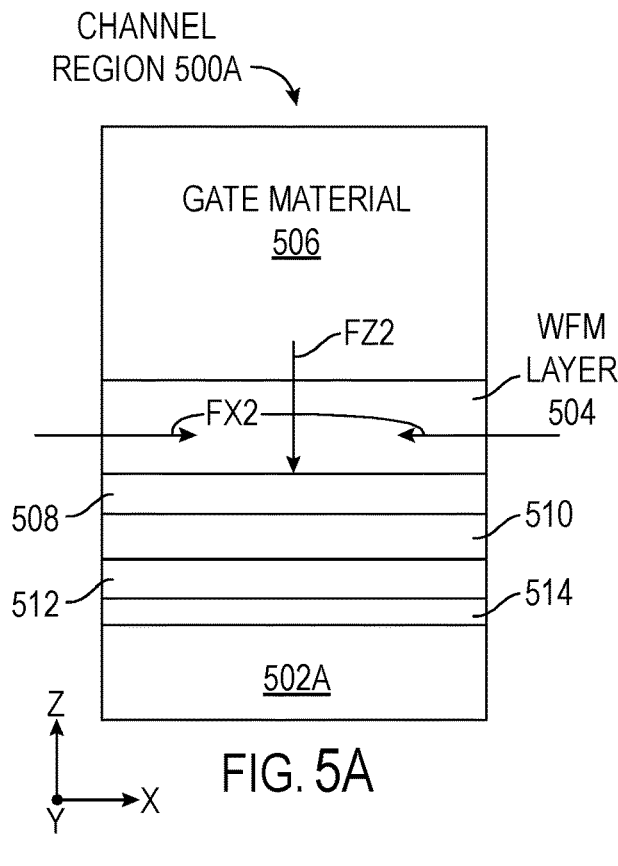
FIG. 5A is a cross-sectional side view of a channel region of a semiconductor slab in a first PMOS FET in a 3D FET structure, including a work function metal layer to provide an improved drive strength.

FIG. 5A is a cross-sectional side view of a first example of a section of a channel region 500A of a semiconductor slab 502A doped to be a PMOS channel. The channel region 500A includes a WFM layer 504 to cause a force FX2 to provide an improved drive strength in the channel region 500A by causing a compressive force to be exerted in a first, X-axis direction. The channel region 500A includes a gate material 506 disposed on the WFM layer 504. The gate material 506 may be one of tungsten (W) and aluminum (Al), for example. As in FIG. 4, the channel region 500A includes a buffer layer 508, a cap layer 510, and dielectric layer 512, and an interfacial layer 514, which may be formed of the materials of the buffer layer 416, cap layer 414, dielectric layer 410, interfacial layer 412 of the channel region 400 in FIG. 4. In contrast to the WFM layer 404 in FIG. 4, the WFM layer 504 is selected to have a work function in a desirable range for a P-type device (e.g., 4.5 eV to 5.5 eV) and to cause a compressive force (rather than a tensile force) in the first direction on the semiconductor slab 502A to improve hole mobility.

Figure 5B:
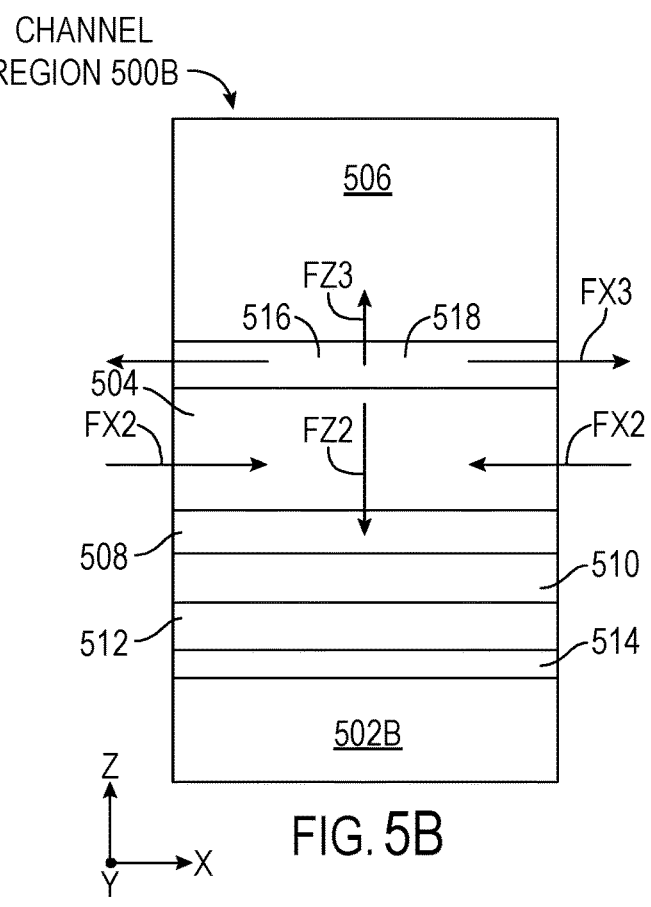
FIG. 5B is a cross-sectional side view of a channel region of a semiconductor slab in a second PMOS FET in a 3D FET structure, including a work function metal layer to provide an improved drive strength.

FIG. 5B is a cross-sectional side view of a second example of a channel region 500B of a semiconductor slab 502B doped to be a PMOS channel. Features of the channel region 500B corresponding to features in channel region 500A have corresponding labels. Except as described below, features of the channel region 500B correspond to the channel region 500A in FIG. 5A.

In addition to having all the labeled layers of the channel region 500A in FIG. 5A, in particular the WFM layer 504, the channel region 500B further includes a second WFM layer 516, which causes a tensile force FX3 counter to the compressive force FX2 of the WFM layer 504. In fabrication, interfacial layer 514, cap layer 510, buffer layer 508, and dielectric layer 512 are deposited in the order shown on PMOS semiconductor slabs 502A and 502B as well as on the NMOS semiconductor slab 402 in FIG. 4. A patterned mask is employed to cover the NMOS semiconductor slab 402 in FIG. 4 while the WFM layer 504 is formed on the PMOS semiconductor slab 502A. Rather than applying another patterned mask to cover the PMOS channel regions, while the WFM layer 404 in FIG. 4 is formed on the NMOS semiconductor slabs 502B, a second patterned mask is not used. Thus, the WFM layer 516, comprising a same material 518 as work function metal 408, is formed on the WFM layer 504 as the WFM layer 404 is being formed on NMOS semiconductor slab 402. Although the addition of a WFM layer 516 provides a (tensile) force FX3 in the first direction counter to the force FX2 in the first direction to compress to the PMOS semiconductor slab 502A, the effect of the force FX3 may be reduced by the WFM layer 516 being a farther distance from the semiconductor slab 502A than the WFM layer 504. In some examples, the force FX3 can be further offset by increasing a thickness of the WFM layer 504. The WFM layer 516 may also cause a force FZ3 in a second, Z-axis direction counter to the force FZ2.

Figure 6A:
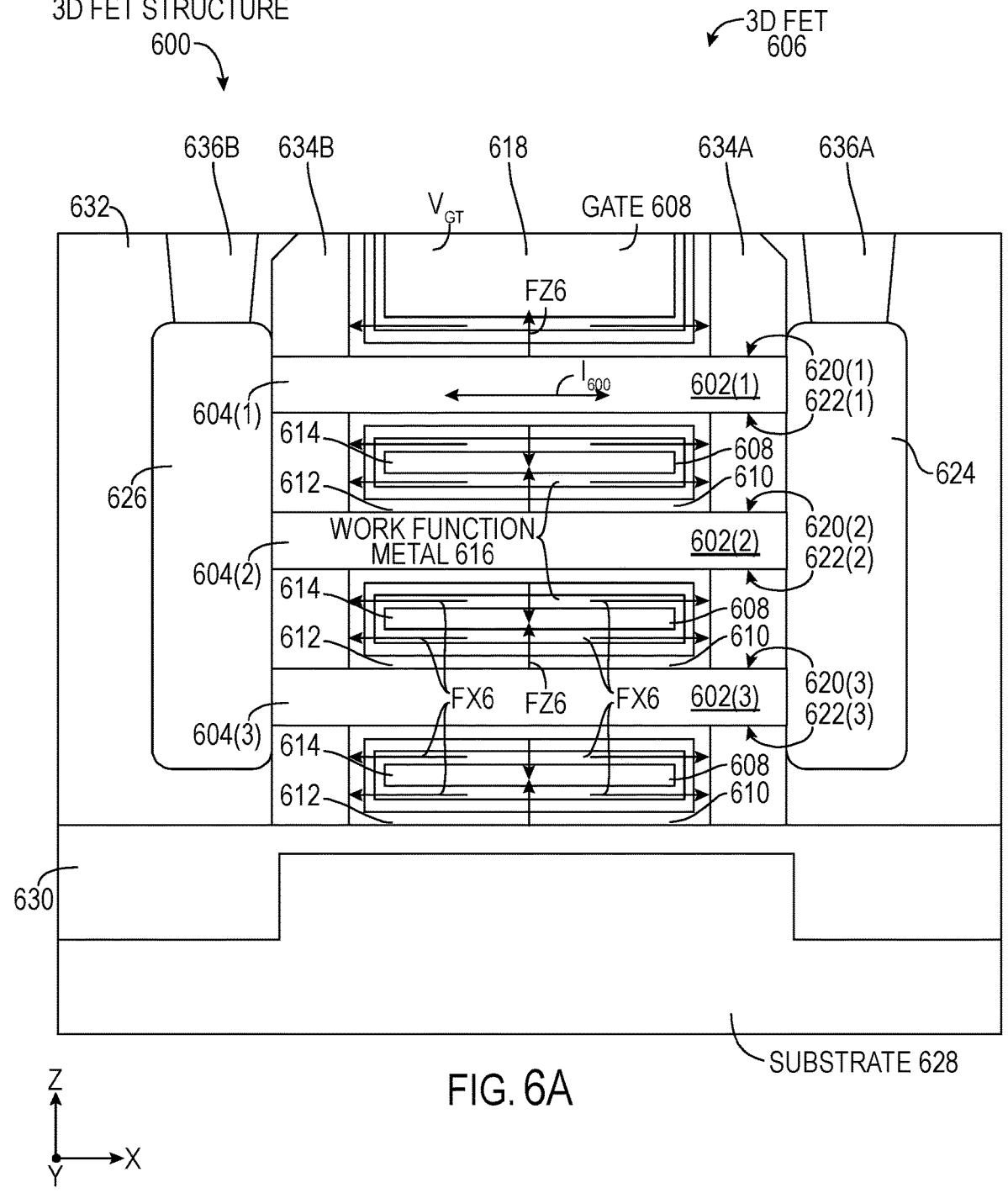
FIG. 6A is a side view of a cross-section along a direction of current flow in a channel region of semiconductor slabs in a GAA FET or CFET having a first type of dopant and a work function metal layer on the channel region to cause a tensile force to improve drive strength.

FIG. 6A is a side view of a cross-section of another example of a 3D FET structure 600 along a direction of flow of a current $I_{600}$ in channel regions 602(1)-602(3) (collectively 602) of semiconductor slabs 604(1)-604(3) (collectively 604) in a 3D FET 606, which may be a GAA FET and may be included in a CFET. The direction of current flow is orthogonal to the longitudinal axis of a gate 608 extending in a second, Y-axis direction (as shown in FIGS. 1-3) and disposed over the semiconductor slabs 604. The channel regions 602 are doped to be NMOS channels. In this regard, FIG. 6A illustrates a dielectric layer 610 and a cap layer 612 corresponding to the dielectric layer 410 and the cap layer 414 in FIG. 4. Although the 3D FET structure 600 in FIG. 6A may include the other layers shown in FIG. 4, which is also an NMOS channel, they are not shown in FIG. 6A for clarity. FIG. 6A also shows that the semiconductor slabs 604 each have a WFM layer 614 formed between the gate 608 and the channel regions 602 and around each of the channel regions 602. The WFM layer 614 includes a work function metal 616 that is a different material than a gate material 618 of the gate 608. The WFM layer 614 is disposed on multiple faces, including opposing first, upper faces 620(1)-620(3) and second, lower faces 622(1)-622(3) of the semiconductor slabs 604.

Flow of the current $I_{600}$ depends on a voltage $V_{GT}$ provided to the gate 608 and also on a voltage potential between source/drain 624 and drain/source 626, which are coupled to opposite ends of the semiconductor slabs 604. Since the channel regions 602 are NMOS channels, the majority carriers are electrons and the beneficial strain that increases mobility of such carriers is caused by a tensile force FX6 in the first, X-axis direction (e.g., the direction of current flow). Forces FZ6 in the Z-axis direction are also caused by expansion or contraction of thickness of the WFM layer 614, but have significantly less effect than the forces FX6.

The 3D FET structure 600 is formed on a substrate 628 and is isolated from the substrate 628 by isolation layer 630, which may be an oxide employed in a shallow trench isolation (STI) layer 630. The 3D FET structure 600 is electrically isolated with an inter-layer dielectric (ILD) layer 632, which may also be an oxide. The source/drain region 624 and the drain/source region 626 are separated from the gate 608 by spacers 634A, 634B. Vias 636A, 636B are provided for vertical interconnection to the source/drain 624 and the drain/source 626.

Figure 6B:
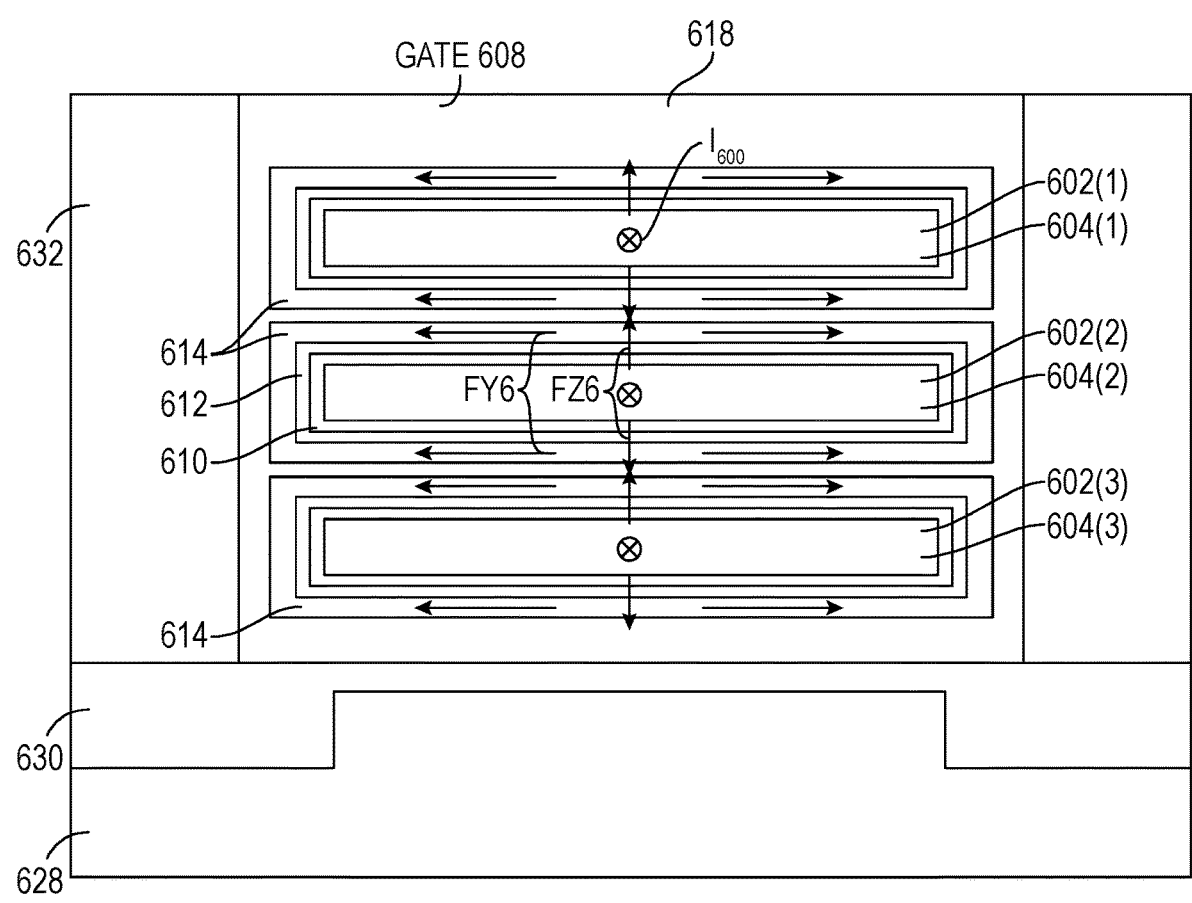
FIG. 6B is a side view of a cross-section orthogonal to a direction of current flow in the channel region of the semiconductor slabs in FIG. 6A.

FIG. 6B is a side view of a cross-section of the 3D FET structure 600 in FIG. 6A orthogonal to the direction of current flow and through the channel regions 602(1)-602(3) of the semiconductor slabs 604(1)-604(3) in FIG. 6A. Features of FIG. 6B shown in FIG. 6A are similarly labeled but not described again. The purpose of FIG. 6B is to show that the dielectric layer 610, the cap layer 612, and the WFM layer 614, respectively, are disposed around multiple sides (e.g., around the perimeter) of the channel regions 602 of the semiconductor slabs 604. In this example, the WFM layer 614 causes forces to be exerted on multiple sides of the channel regions 602 to improve carrier mobility. FIG. 6B also shows the gate 608 comprising the gate material 618 disposed around (all sides of) the channel regions 602 to control the current $I_{600}$. Also shown in FIG. 6B are the forces FZ6 in the Z-axis direction and forces FY6 in the Y-axis direction. These forces may contribute positively or negatively, but a net result of forces FX6, FY6, and FZ6 on the channel regions 602 is to improve carrier mobility.

Figure 7A:
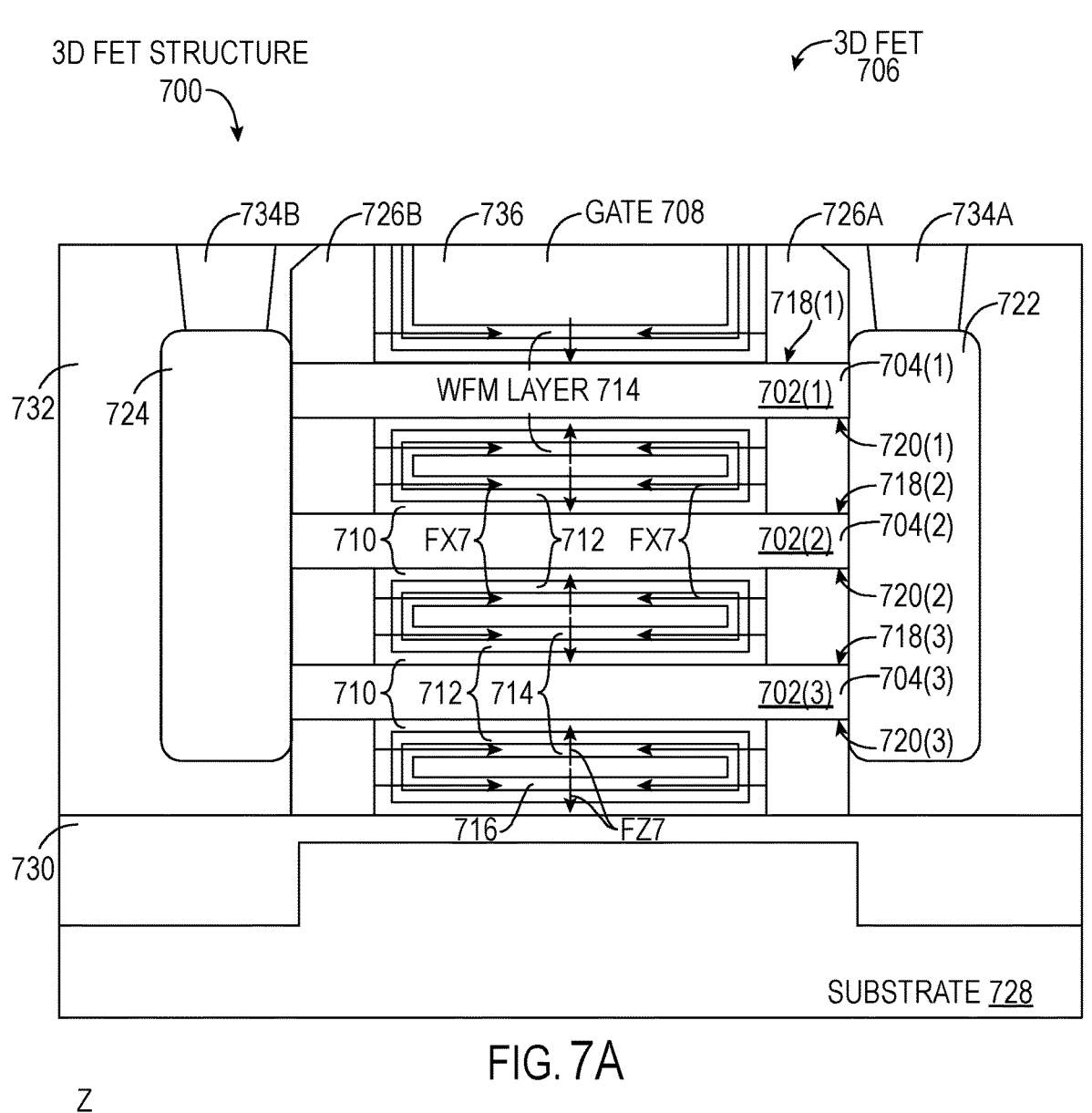
FIG. 7A is a side view of a cross-section along a direction of current flow in a channel region of semiconductor slabs in a GAA FET or CFET having a second type of dopant and a work function metal layer on the channel region to cause a compressive force to improve drive strength.

FIG. 7A is a side view of a cross-section of another example of a 3D FET structure 700 along a first direction of flow of a current $I_{700}$ in channel regions 702(1)-702(3) (collectively 702) of semiconductor slabs 704(1)-704(3) (collectively 704) in a 3D FET 706, which may be a GAA FET and may be included in a CFET. The first, X-axis direction of current flow is orthogonal to the longitudinal axis of a gate 708 extending in a second, Y-axis direction (as shown in FIGS. 1-3) and disposed over the semiconductor slabs 704. The channel regions 702 are doped to be PMOS channels. FIG. 7A illustrates a dielectric layer 710 and cap layer 712, corresponding to the dielectric layer 610 and the cap layer 612 in FIG. 6. Although the 3D FET structure 700 may include the other layers shown in FIG. 5A or 5B, they are not shown in FIG. 7A for clarity. FIG. 7A shows that the semiconductor slabs 704 each have a WFM layer 714 formed between the gate 708 and the channel regions 702 around the channel regions 702. Thus, a work function metal 716 of the WFM layer 714 is disposed on multiple faces, including opposing first, upper faces 718(1)-718(3) and second, lower faces 720(1)-720(3) of each of the semiconductor slabs 704. The 3D FET structure 700 may correspond to the 3D FET 600 in FIG. 6A in all respects except with regard to a dopant type in the semiconductor slabs 704 and the force caused by the WFM layer 714. The semiconductor slabs 704 are doped to be PMOS channels and, accordingly, the WFM layer 714 causes a compressive (rather than tensile) force FX7 on the channel regions 702.

The 3D FET structure 700 includes source/drain 722 and drain/source 724, which are coupled to opposite ends of the semiconductor slabs 704 and are isolated from the gate 708 by spacers 726A, 726B. Since the channel regions 702 are PMOS channels, the majority carriers are holes and the beneficial strain that increases mobility of such carriers is caused by the compressive force FX7 in the first, X-axis direction (e.g., the direction of current flow). Forces FZ7 in the Z-axis direction, caused by shrinkage or contraction of thickness of the WFM layer 714, have significantly less impact (positive or negative) on the carrier mobility in the channel regions 702 than the forces FX7. The 3D FET structure 700 is formed on a substrate 728 and is isolated from the substrate 728 by STI layer 730. The 3D FET structure 700 is also isolated with an ILD layer 732. Vias 734A, 734B are provided for vertical interconnection to the source/drain 722 and the drain/source 724. The gate 708 is formed of a gate material 736 that is different than the work function metal 716.

Figure 7B:
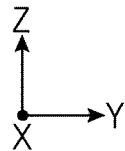
FIG. 7B is a side view of a cross-section orthogonal to a direction of current flow in the channel region of the semiconductor slabs in FIG. 7A.

FIG. 7B is a side view of a cross-section of the 3D FET structure 700 in FIG. 7A orthogonal to the direction of flow of current $I_{700}$ and through the channel regions 702(1)-702(3) of the semiconductor slabs 704(1)-704(3) in FIG. 7A. FIG. 7B is provided to show that the WFM layer 714 is disposed around the semiconductor slabs 704(1)-704(3) in the channel regions 702(1)-702(3). Thus, the WFM layer 714 includes the work function metal 716 disposed on at least the first, upper faces 718(1)-718(3) and the opposing second, lower faces 720(1)-720(3) to cause the compressive forces FX7 to be exerted on the channel regions 702 in the first direction. The WFM layer 714 may also cause the forces FZ7 in the Z-axis direction and forces FY7 in the Y-axis direction (lateral to the channel regions 702(1)-702(3), but a net result of forces FX7 (not shown in FIG. 7B), FY7, and FZ7 on the channel regions 702 is to improve carrier mobility.

FIG. 8 is a flowchart illustrating a method 800 of fabricating a 3D FET structure including, but not limited to, any of the 3D FET structures in FIGS. 1-3 and 6A-7B. The method includes forming at least one semiconductor slab 604, 704, each comprising a first face 620, 718 and a second face 622, 720 opposite to the first face 620, 718 (block 802); forming a dielectric layer 610, 710 disposed on the first face 620, 718 and the second face 622, 720 in a channel region 602, 702 of the at least one semiconductor slab 604, 704 (block 804); forming a work function metal layer 614, 714 comprising a work function metal 616, 716 disposed on the dielectric layer 610, 710 (block 806); and forming a gate 608, 708 comprising a gate material 618, 736 disposed on the work function metal layer 614, 714 (block 808), wherein: the channel region 602, 702 of each of the at least one semiconductor slab 604, 704 is configured to conduct current $I_{600}$, $I_{700}$ in a first direction; and the work function metal layer 614, 714 causes a force FX6, FX7 on the channel region 602, 702 of the at least one semiconductor slab 604, 704 in the first direction.

Figure 9:
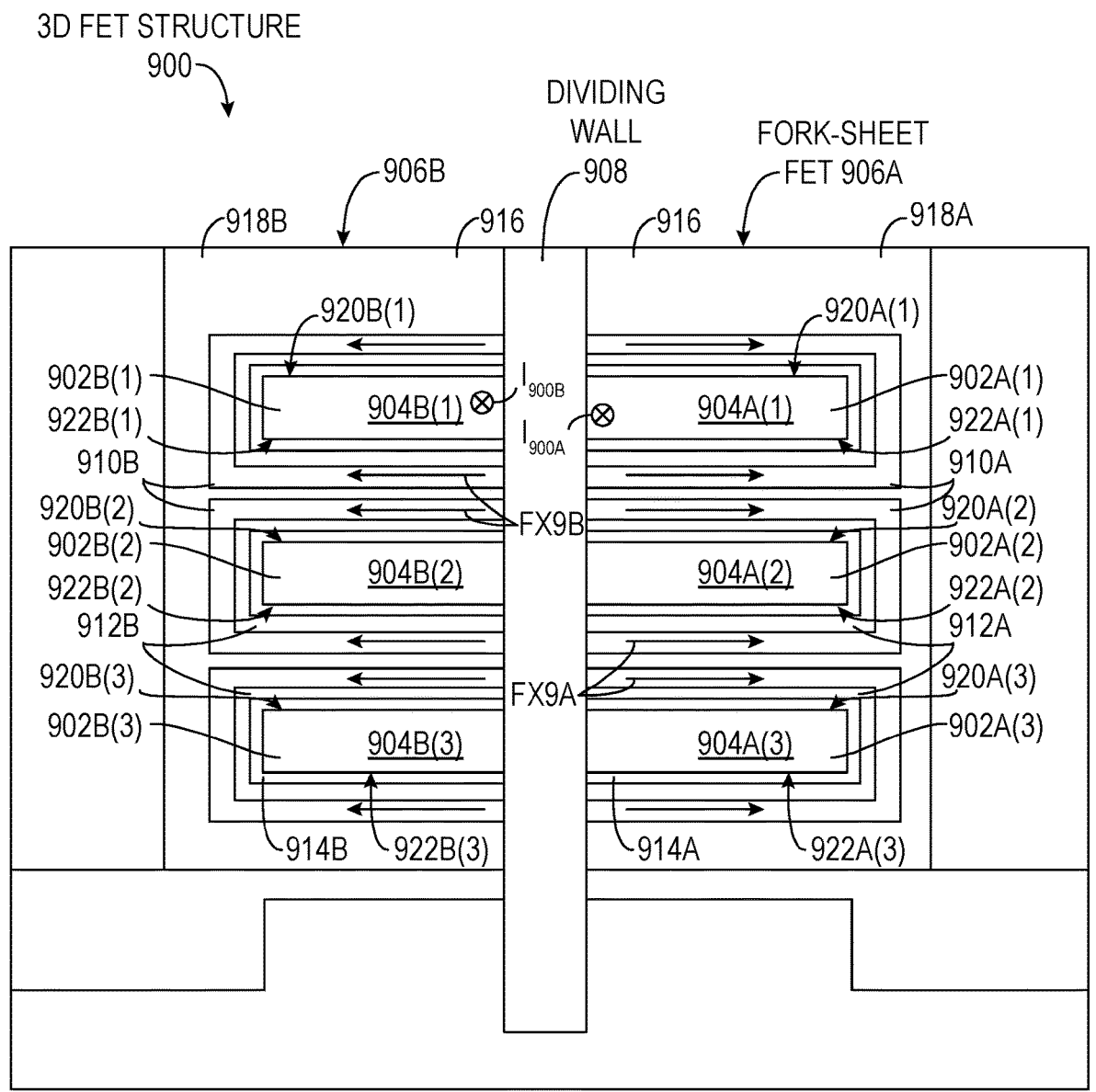
FIG. 9 is a cross-sectional side view of a fork-sheet FET across the channel region of the semiconductor slab orthogonal to the direction of current flow and illustrating the work function metal layer disposed on opposing faces of the channel region to cause forces to be exerted in a current direction to provide an improved drive strength.

FIG. 9 is a side view of a cross-section in another example of a 3D FET structure 900 orthogonal to a first direction of flow of a current $I_{900A}$ in channel regions 902A(1)-902A(3) (collectively 902A) of semiconductor slabs 904A(1)-904A(3) (collectively 904A) and current $I_{900B}$ in channel regions 902B(1)-902B(3) (collectively 902B) of semiconductor slabs 904B(1)-904B(3) (collectively 904B) in fork-sheet FETs 906A and 906B. The 3D FET structure 900 may be the 3D FET structure 300 shown in FIG. 3. Formation of a dividing wall 908 separated the semiconductor slabs 904A from the semiconductor slabs 904B. Each of the semiconductor slabs 904A includes a first WFM layers 910A, a first cap layers 912A, and a first dielectric layers 914A, and each of the semiconductor slabs 904B includes second WFM layers 910B, second cap layers 912B, and second dielectric layers 914B. The WFM layers 910A, 910B, cap layers 912A, 912B, and dielectric layers 914A, 914B are between the semiconductor slabs 904A, 904B. A first gate 918A and a second gate 918B, each comprising a gate material 916, are disposed around the channel regions 902A, 902B, respectively, to control the currents $I_{900A}$ and $I_{900B}$. The WFM layers 910A, 910B, cap layers 912A, 912B, and dielectric layers 914A, 914B correspond to the WFM layers 614, 714, the cap layers 612, 712, and the dielectric layers 610, 710 in FIGS. 6A, 6B, 7A, and 7B, which are representative subsets of the layers shown in FIGS. 4, 5A, and 5B.

FIG. 9 is provided to show that, in the fork-sheet FETs 906A, the WFM layer 910A is disposed on at least first, upper faces 920A(1)-920A(3) and second, lower faces 922A(1)-922A(3) (opposite to the upper faces 920A(1)-920A(3)) of the channel regions 902A. The WFM layer 910B is provided on at least third, upper faces 920B(1)-920B(3) and fourth, lower faces 922B(1)-922B(3) of the channel regions 902A. The WFM layers 910A, 910B are provided to cause forces FX9A, FX9B to be exerted in the first, X-axis direction (e.g., the direction of flow of currents $I_{900A}$ and $I_{900B}$). The channel regions 902A and 902B may be doped to be NMOS channels or PMOS channels, and the WFM layers 910A and 910B are selected to provide a tensile force in the first direction in NMOS channels and a compressive force in the first direction in PMOS channels.

Figure 10:
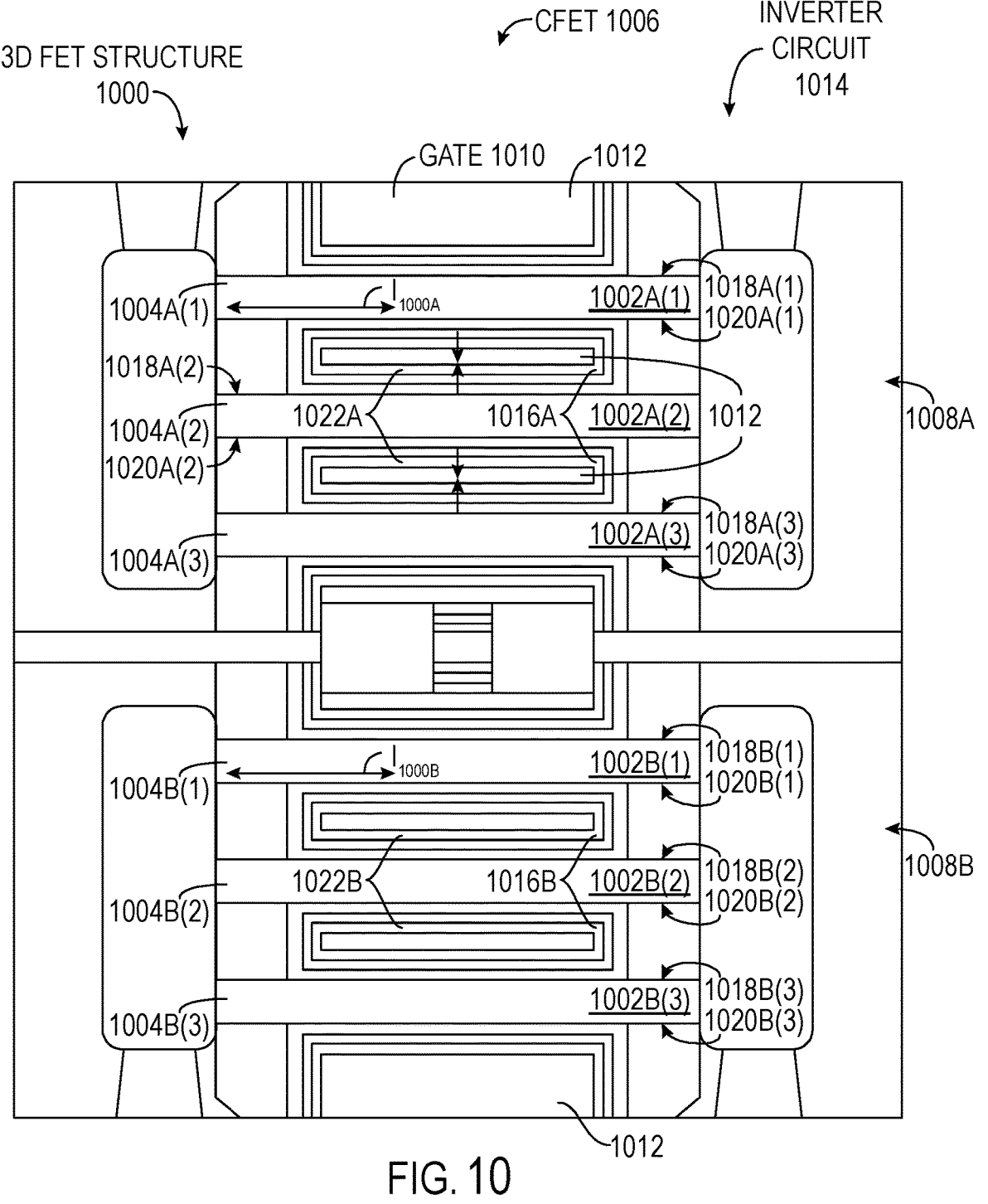
FIG. 10 is a cross-sectional side view of a CFET or stacked GAA FETs across the channel region of semiconductor slabs and orthogonal to the direction of current flow and illustrating the work function metal layer disposed around a perimeter of the channel region to cause forces to be exerted in a current direction to provide an improved drive strength.

FIG. 10 is a side view of a cross-section of a 3D FET structure 1000 along a first direction of flow of a current $I_{1000A}$ in channel regions 1002A(1)-1002A(3) (collectively

1002A) of semiconductor slabs 1004A(1)-1004A(3) (collectively 1004A) and current $I_{1000B}$ in channel regions 1002B(1)-1002B(3) (collectively 1002B) of semiconductor slabs 1004B(1)-1004B(3) (collectively 1004B). The 3D FET structure 1000 includes a CFET 1006 having respective GAA FETs 1008A and 1008B. A gate 1010 includes gate material 1012 disposed around the semiconductor slabs 1004A and the semiconductor slabs 1004B to control the currents $I_{1000A}$ and $I_{1000B}$. The GAA FETs 1008A and 1008B an NMOS channel FET and a PMOS channel FET employed to implement an inverter circuit 1014.

The 3D FET structure 1000 is provided to show that the channel regions 1002A and 1002B have first WFM layers 1016A and second WFM layers 1016B, respectively, disposed on upper surfaces 1018A, 1018B and on opposing lower surfaces 1020A, 1020B. Work function metals 1022A and 1022B of the WFM layers 1016A, 1016B are selected to cause appropriate beneficial forces (e.g., tensile for NMOS channels and compressive for PMOS channels) to be exerted on the channel regions 1002A and 1002B to improve carrier mobility and, therefore, drive strength and performance of the inverter circuit 1014.

Electronic devices that include 3D FET structures, including work function metal layers disposed on opposing faces of the channel region to cause forces to be exerted in a current direction to provide an improved drive strength in FIGS. 1-7B, 9, and 10 and according to, but not limited to, any of the exemplary fabrication processes in FIG. 8, and according to any aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 11:
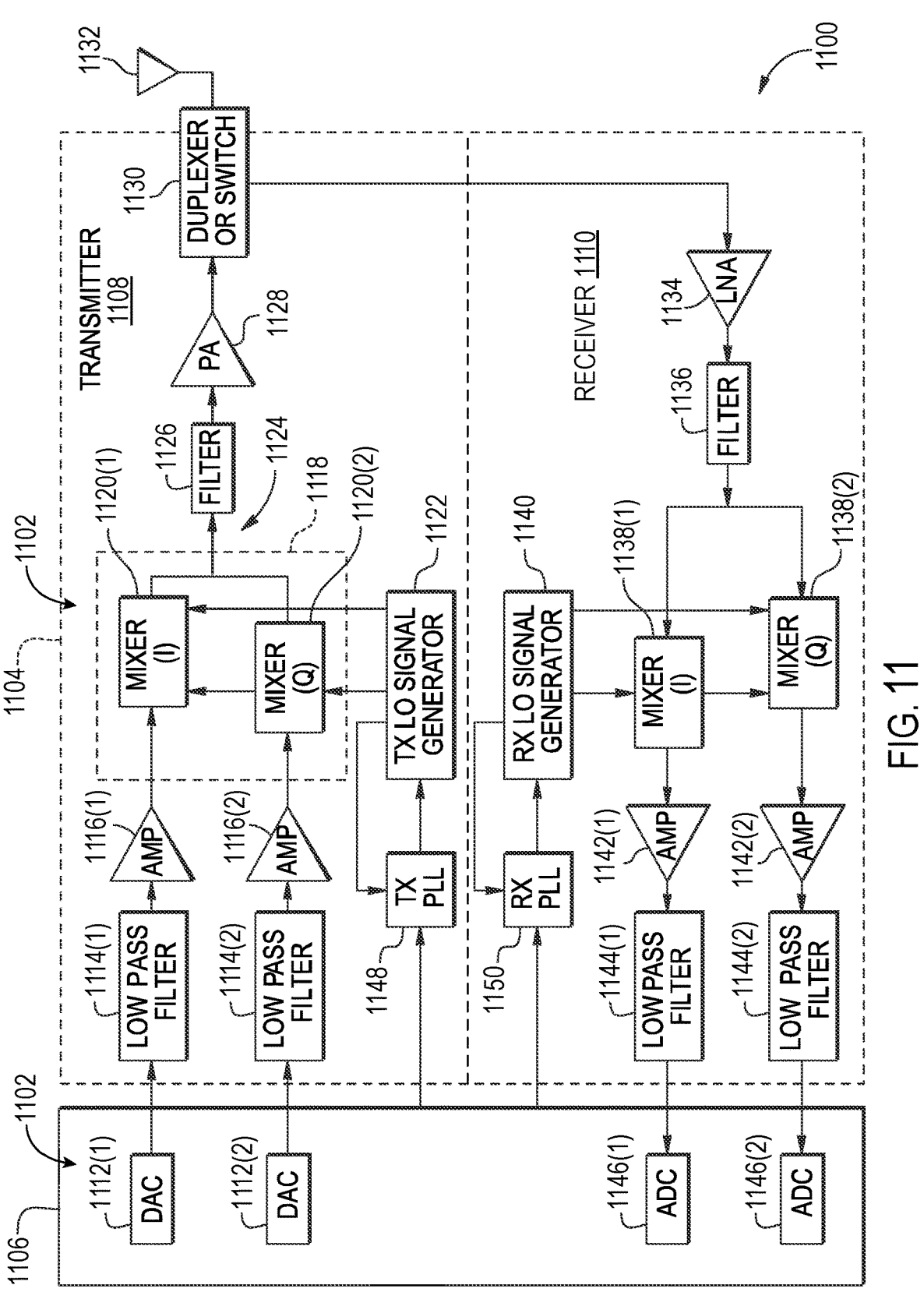
FIG. 11 is a block diagram of an exemplary wireless communication device that includes radio-frequency (RF) components that can include 3D FET structures, including work function metal layer disposed on opposing faces of the channel region to cause forces to be exerted in a current direction to provide an improved drive strength in FIGS. 1-7B, 9, and 10 and according to, but not limited to, any of the exemplary fabrication processes in FIG. 8.

In this regard, FIG. 11 illustrates a block diagram of an exemplary wireless communications device 1100 that includes radio frequency (RF) components formed from one or more ICs 1102, wherein any of the ICs 1102 can include integrated circuits, including 3D FET structures, including work function metal layers disposed on opposing faces of the channel region, to cause forces to be exerted in a current direction to provide an improved drive strength in FIGS. 1-3, 6A-7B, 9, and 10, and according to any aspects disclosed herein. The wireless communications device 1100 may include or be provided as examples in any of the above-referenced devices. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110, which support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112 (2) for converting digital signals generated by the data processor 1106 into I and Q analog output signals, e.g., I and Q output currents, for further processing.

Within the transmitter 1108, lowpass filters 1114(1), 1114 (2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals from a TX LO signal generator 1122 through mixers 1120(1), 1120(2) to provide an upconverted signal 1124. A filter 1126 filters the upconverted signal 1124 to remove undesired signals caused by the frequency upconversion and noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1),1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1),1142(2) and further filtered by lowpass filters 1144(1),1144(2) to obtain I and Q analog input signals, which are provided to the data processor 1106. In this example, the data processor 1106 includes analog-to-digital converters (ADCs) 1146(1),1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Figure 12:
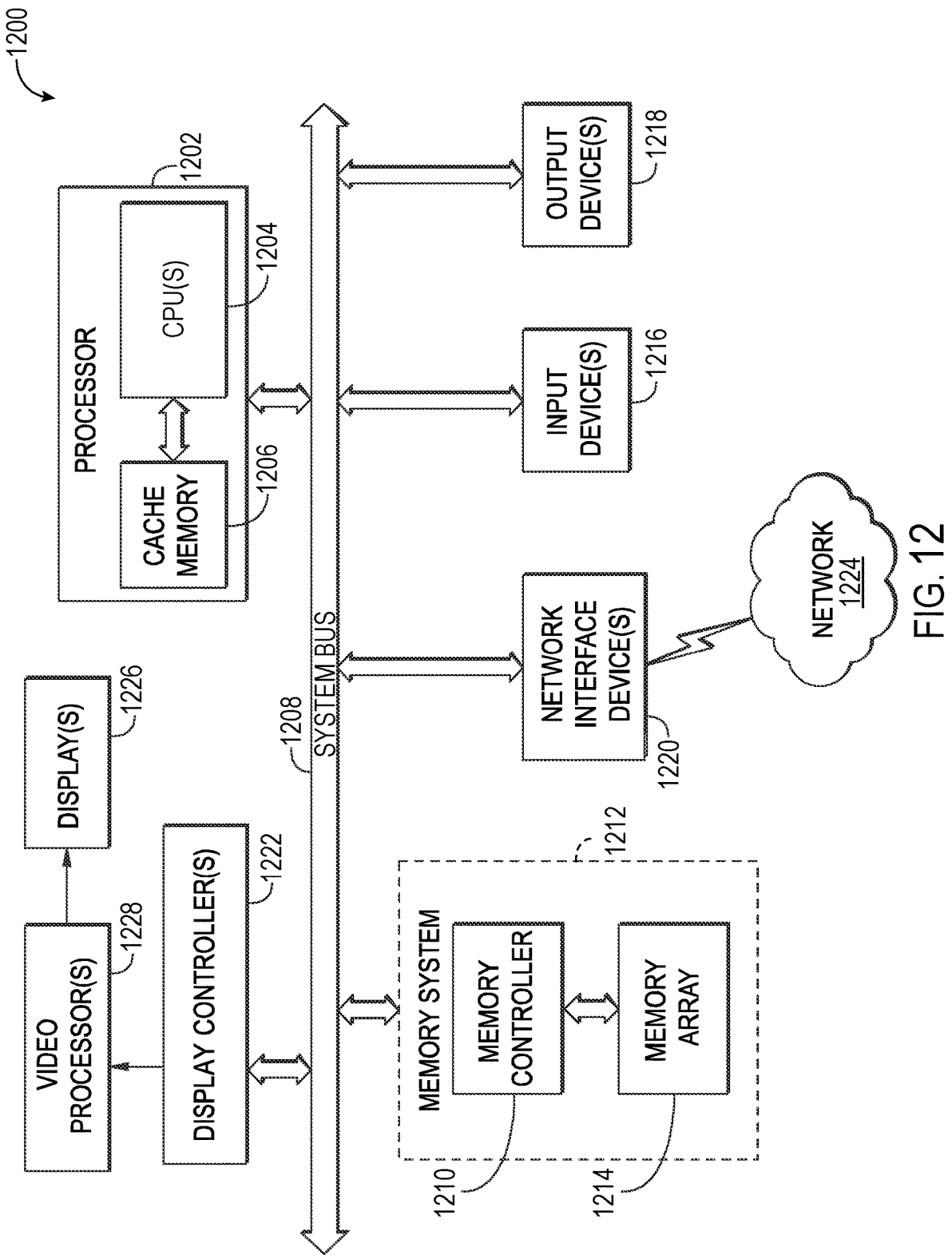
FIG. 12 is a block diagram of an exemplary processor-based system that can include the 3D dual complementary-circuit structure, including 3D FETs, including work function metal layer disposed on opposing faces of the channel region to cause forces to be exerted in a current direction to provide an improved drive strength in FIGS. 1-7B, 9, and 10 and according to, but not limited to, any of the exemplary fabrication processes in FIG. 8.

FIG. 12 illustrates a block diagram of an example of a processor-based system 1200 that can employ integrated circuits, including 3D FET structures, including work function metal layer disposed on opposing faces of the channel regions to cause forces to be exerted in a current direction to provide an improved drive strength in FIGS. 1-3, 6A-7B, 9, and 10. In this example, the processor-based system 1200 includes one or more central processor units (CPUs) 1202, which may also be referred to as CPU or processor cores, each including one or more processors 1204. The CPU(s) 1202 may have cache memory 1206 coupled to the processor(s) 1204 for rapid access to temporarily stored data. The CPU(s) 1202 is coupled to a system bus 1208 and can intercouple master and secondary device devices included in the processor-based system 1200. As is well known, the CPU(s) 1202 communicates with these other devices by exchanging address, control, and data information over the system bus 1208. For example, the CPU(s) 1202 can communicate bus transaction requests to a memory controller 1210 as an example of a slave device. Although not illustrated in FIG. 12, multiple system buses 1208 could be provided wherein each system bus 1208 constitutes a different fabric.

Other master and slave devices can be connected to the system bus 1208. As illustrated in FIG. 12, these devices can include a memory system 1212 that includes the memory controller 1210 and one or more memory arrays 1214, one or more input devices 1216, one or more output devices 1218, one or more network interface devices 1220, and one or more display controllers 1222, as examples. The input device(s) 1216 can include any type of input device, including, but not limited to, input keys, switches, voice processors, etc. The output device(s) 1218 can include any type of output device, including, but not limited to, audio, video, other visual indicators, etc. The network interface device(s) 1220 can be any device configured to allow an exchange of data to and from a network 1224. The network 1224 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1220 can be configured to support any type of communications protocol desired.

The CPU(s) 1202 may also be configured to access the display controller(s) 1222 over the system bus 1208 to control information sent to one or more displays 1226. The display controller(s) 1222 sends information to the display(s) 1226 to be displayed via one or more video processors 1228, which process the information to be displayed into a format suitable for the display(s) 1226. The display(s) 1226 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any desired information. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. A three-dimensional (3D) field-effect transistor (FET) structure, comprising:
   at least one semiconductor slab, each comprising a first face and a second face opposite to the first face;
   a dielectric layer disposed on the first face and the second face in a channel region of the at least one semiconductor slab;
   a work function metal layer comprising a work function metal disposed on the dielectric layer; and
   a gate comprising a gate material disposed on the work function metal layer;
   wherein:
      the channel region of each of the at least one semiconductor slab is configured to conduct current in a first direction; and
      the work function metal layer is configured to cause a first force on the channel region of the at least one semiconductor slab in the first direction.

2. The 3D FET structure of clause 1, wherein the at least one the work function metal is a different material than the gate material.

3. The 3D FET structure of clause 1 or 2, wherein the work function metal layer is further configured to cause a second force to be exerted on the channel region in a second direction orthogonal to the first direction.

4. The 3D FET structure of any of clauses 1-3, wherein:
   the at least one semiconductor slab is doped with a trivalent dopant; and
   the work function metal layer configured to cause the first force is configured to cause a tensile force to be exerted on the channel region in the first direction.

5. The 3D FET structure of clause 4, wherein the work function metal has a work function in a range of 4.0 to 4.25 electron volts (eV).

6. The 3D FET structure of clause 4, wherein the work function metal comprises manganin nitride (MnN) and the gate material comprises one of aluminum and tungsten.

7. The 3D FET structure of any of clauses 1-3, wherein:
   the at least one semiconductor slab is doped with a pentavalent dopant; and
   the work function metal layer configured to cause the first force is configured to cause a compressive force to be exerted on the channel region in the first direction.

8. The 3D FET structure of clause 7, wherein the work function metal has a work function in a range of 4.5 to 5.5 electron volts (eV).

9. The 3D FET structure of clause 7, wherein the work function metal comprises one of silver (Ag), iron nitride (FeN), and nickel aluminum (NiAl) and the gate material comprises one of aluminum and tungsten.

10. The 3D FET structure of any of clauses 7-9, the work function metal layer comprising:
a first work function metal layer comprising one of silver (Ag), iron nitride (FeN), and nickel aluminum (NiAl); and
a second work function metal layer comprising manganin nitride (MnN).

11. The 3D FET structure of any of clauses 7-10, wherein the work function metal does not comprise titanium (Ti) aluminum (Al) (TiAl).

12. The 3D FET structure of any of clauses 1-11, comprising:
a first thickness of the work function metal layer is less than 2 nanometers (nm); and
a second thickness of the gate material disposed on the work function metal layer is at least 50 nm.

13. The 3D FET structure of any of clauses 1-12, comprising one of titanium nitride (TiN) layer and a tantalum nitride (TaN) layer between the work function metal and the dielectric layer.

14. The 3D FET structure of any of clauses 1-13, wherein the 3D FET structure comprises one of a gate-all-around FET, a fork-sheet FET, and a complementary FET.

15. The 3D FET structure of any of clauses 1-14, integrated into an integrated circuit.

16. The 3D FET structure of any of clauses 1-15 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

17. A three-dimensional (3D) complementary field-effect transistor (FET) (CFET) structure comprising:
a first type FET comprising:
at least one first semiconductor slab each comprising a first face and a second face opposite to the first face;
a first dielectric layer disposed on the first face and the second face in a channel region of the at least one first semiconductor slab;
a first work function metal layer comprising a first work function metal disposed on the first dielectric layer; and
a first gate comprising a gate material disposed on the first work function metal layer; and
a second type FET comprising:
at least one second semiconductor slab each comprising a third face and a fourth face opposite to the third face;
a second dielectric layer disposed on the third face and the fourth face in a channel region of the at least one second semiconductor slab;
a second work function metal layer comprising a second work function metal disposed on the second dielectric layer; and a second gate comprising the gate material disposed on the second work function metal layer;
wherein:
the first work function metal layer is configured to cause a tensile force on the channel region of the at least one first semiconductor slab; and
the second work function metal layer is configured to cause a compressive force on the channel region of the at least one second semiconductor slab.

18. The 3D CFET structure of clause 17, comprising one of a gate-all-around FET and a fork-sheet FET.

19. The 3D CFET structure of clause 17 or 18, wherein the gate material is different than the first work function metal and the second work function metal.

20. The 3D CFET structure of any of clauses 17-19, wherein:
the first work function metal has a work function in a range of 4.0 to 4.25 electron volts (eV); and
the second work function metal has a work function in a range of 4.5 to 5.5 eV.

21. The 3D CFET structure of any of clauses 17-20, wherein:
the first work function metal comprises manganin nitride (MnN); and
the second work function metal comprises one of silver (Ag), iron nitride (FeN), and nickel aluminum (NiAl).

22. The 3D CFET structure of any of clauses 17-21, the second work function metal layer comprising:
a third work function metal layer comprising one of silver (Ag), iron nitride (FeN), and nickel aluminum (NiAl); and
a fourth work function metal layer comprising manganin nitride (MnN).

23. A method of fabricating a complementary three-dimensional (3D) field-effect transistor (FET) structure comprising:
forming at least one semiconductor slab, each comprising a first face and a second face opposite to the first face;
forming a dielectric layer disposed on the first face and the second face in a channel region of the at least one semiconductor slab;
forming a work function metal layer comprising a work function metal disposed on the dielectric layer; and
forming a gate comprising a gate material disposed on the work function metal layer;
wherein:
the channel region of each of the at least one semiconductor slab is configured to conduct current in a first direction; and
the work function metal layer causes a force on the channel region of the at least one semiconductor slab in the first direction.

What is claimed is:
1. A three-dimensional (3D) field-effect transistor (FET) structure, comprising:
at least one semiconductor slab, each comprising a first face and a second face opposite to the first face;
a dielectric layer disposed on the first face and the second face in a channel region of the at least one semiconductor slab;
a work function metal layer comprising a work function metal disposed on the dielectric layer; and
a gate comprising a gate material disposed on the work function metal layer;

wherein:

the channel region of each of the at least one semiconductor slab is configured to conduct current in a first direction; and the work function metal layer is configured to cause a first force on the channel region of the at least one semiconductor slab in the first direction.

2. The 3D FET structure of claim 1, wherein the at least one the work function metal is a different material than the gate material.

3. The 3D FET structure of claim 1, wherein the work function metal layer is further configured to cause a second force to be exerted on the channel region in a second direction orthogonal to the first direction.

4. The 3D FET structure of claim 1, wherein:

the at least one semiconductor slab is doped with a trivalent dopant; and the work function metal layer configured to cause the first force is configured to cause a tensile force to be exerted on the channel region in the first direction.

5. The 3D FET structure of claim 4, wherein the work function metal has a work function in a range of 4.0 to 4.25 electron volts (eV).

6. The 3D FET structure of claim 4, wherein the work function metal comprises manganin nitride (MnN) and the gate material comprises one of aluminum and tungsten.

7. The 3D FET structure of claim 1, wherein:

the at least one semiconductor slab is doped with a pentavalent dopant; and the work function metal layer configured to cause the first force is configured to cause a compressive force to be exerted on the channel region in the first direction.

8. The 3D FET structure of claim 7, wherein the work function metal has a work function in a range of 4.5 to 5.5 electron volts (eV).

9. The 3D FET structure of claim 7, wherein the work function metal comprises one of silver (Ag), iron nitride (FeN), and nickel aluminum (NiAl) and the gate material comprises one of aluminum and tungsten.

10. The 3D FET structure of claim 7, the work function metal layer comprising:

a first work function metal layer comprising one of silver (Ag), iron nitride (FeN), and nickel aluminum (NiAl); and a second work function metal layer comprising manganin nitride (MnN).

11. The 3D FET structure of claim 7, wherein the work function metal does not comprise titanium (Ti) aluminum (Al) (TiAl).

12. The 3D FET structure of claim 1, comprising:

a first thickness of the work function metal layer is less than 2 nanometers (nm); and a second thickness of the gate material disposed on the work function metal layer is at least 50 nm.

13. The 3D FET structure of claim 1, comprising one of titanium nitride (TiN) layer and a tantalum nitride (TaN) layer between the work function metal and the dielectric layer.

14. The 3D FET structure of claim 1, wherein the 3D FET structure comprises one of a gate-all-around FET, a fork-sheet FET, and a complementary FET.

15. The 3D FET structure of claim 1, integrated into an integrated circuit.

16. The 3D FET structure of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

17. A three-dimensional (3D) complementary field-effect transistor (FET) (CFET) structure comprising:

a first type FET comprising:

at least one first semiconductor slab each comprising a first face and a second face opposite to the first face;

a first dielectric layer disposed on the first face and the second face in a channel region of the at least one first semiconductor slab;

a first work function metal layer comprising a first work function metal disposed on the first dielectric layer; and a first gate comprising a gate material disposed on the first work function metal layer; and a second type FET comprising:

at least one second semiconductor slab each comprising a third face and a fourth face opposite to the third face;

a second dielectric layer disposed on the third face and the fourth face in a channel region of the at least one second semiconductor slab;

a second work function metal layer comprising a second work function metal disposed on the second dielectric layer; and a second gate comprising the gate material disposed on the second work function metal layer;

wherein:

the first work function metal layer is configured to cause a tensile force on the channel region of the at least one first semiconductor slab; and the second work function metal layer is configured to cause a compressive force on the channel region of the at least one second semiconductor slab.

18. The 3D CFET structure of claim 17, comprising one of a gate-all-around FET and a fork-sheet FET.

19. The 3D CFET structure of claim 17, wherein the gate material is different than the first work function metal and the second work function metal.

20. The 3D CFET structure of claim 17, wherein:

the first work function metal has a work function in a range of 4.0 to 4.25 electron volts (eV); and the second work function metal has a work function in a range of 4.5 to 5.5 eV.

21. The 3D CFET structure of claim 17, wherein:

the first work function metal comprises manganin nitride (MnN); and the second work function metal comprises one of silver (Ag), iron nitride (FeN), and nickel aluminum (NiAl).

22. The 3D CFET structure of claim 17, the second work function metal layer comprising:

a third work function metal layer comprising one of silver (Ag), iron nitride (FeN), and nickel aluminum (NiAl); and a fourth work function metal layer comprising manganin nitride (MnN).

23. A method of fabricating a complementary three-dimensional (3D) field-effect transistor (FET) structure comprising:

forming at least one semiconductor slab, each comprising a first face and a second face opposite to the first face;

forming a dielectric layer disposed on the first face and the second face in a channel region of the at least one semiconductor slab;

forming a work function metal layer comprising a work function metal disposed on the dielectric layer; and forming a gate comprising a gate material disposed on the work function metal layer;

wherein:

the channel region of each of the at least one semiconductor slab is configured to conduct current in a first direction; and the work function metal layer causes a force on the channel region of the at least one semiconductor slab in the first direction.

\*   \*   \*   \*   \*